(12) United States Patent
Percival et al.

(10) Patent No.: US 10,529,537 B1
(45) Date of Patent: Jan. 7, 2020

(54) ELECTRON FLOOD LITHOGRAPHY

(71) Applicant: Facebook Technologies, LLC, Menlo Park, CA (US)

(72) Inventors: Christopher Percival, Blarney (IE); James Small, Glasgow (GB)

(73) Assignee: Facebook Technologies, LLC, Menlo Park, CA (US)

(*) Notice: Subject to any disclaimer, the term of this patent is extended or adjusted under 35 U.S.C. 154(b) by 0 days.

(21) Appl. No.: 15/894,813

(22) Filed: Feb. 12, 2018

(51) Int. Cl.
| | |
|---|---|
| *H01L 21/00* | (2006.01) |
| *H01J 37/30* | (2006.01) |
| *H01L 21/3065* | (2006.01) |
| *H01L 21/308* | (2006.01) |
| *H01L 21/263* | (2006.01) |
| *G03F 7/20* | (2006.01) |
| *H01J 37/317* | (2006.01) |

(52) U.S. Cl.
CPC ........ *H01J 37/3007* (2013.01); *G03F 7/2037* (2013.01); *G03F 7/2047* (2013.01); *G03F 7/70075* (2013.01); *H01J 37/3175* (2013.01); *H01L 21/2636* (2013.01); *H01L 21/308* (2013.01); *H01L 21/3065* (2013.01); *G03F 2007/2067* (2013.01); *H01J 2237/152* (2013.01)

(58) Field of Classification Search
CPC ............... H01J 37/3007; H01J 37/3175; H01J 37/3174; H01J 37/3026; H01J 2237/152; G03F 7/2037; G03F 7/2047; G03F 7/70075; G03F 2007/2067; H01L 21/2636; H01L 21/3065; H01L 21/308; H01L 21/027; H01L 21/063; H01L 21/0337; H01L 21/28512
See application file for complete search history.

(56) References Cited

U.S. PATENT DOCUMENTS

| | | | | | |
|---|---|---|---|---|---|
| 2,986,668 | A | * | 5/1961 | Haflinger | H01J 29/46 313/432 |
| 4,152,599 | A | * | 5/1979 | Frosien | G01R 17/00 219/121.29 |
| 5,831,272 | A | * | 11/1998 | Utsumi | B82Y 10/00 250/492.2 |
| 6,316,151 | B1 | * | 11/2001 | Kim | G03F 1/20 250/492.3 |
| 2009/0244793 | A1 | * | 10/2009 | Kuroda | B82Y 10/00 360/328 |

* cited by examiner

*Primary Examiner* — Nikolay K Yushin
(74) *Attorney, Agent, or Firm* — Fenwick & West LLP

(57) ABSTRACT

A lithography system includes an electron source, a lens, and a stencil mask. The electron source emits a beam of electrons. The lens converts the emitted beam of electrons into a diffuse beam of parallel electrons. The stencil mask is positioned between the lens and a semiconductor wafer with an electron-sensitive resists. The stencil mask has a pattern to selectively pass portions of the diffuse beam of parallel electrons onto the electron-sensitive resist of the wafer.

17 Claims, 4 Drawing Sheets

ELECTRON FLOOD LITHOGRAPHY

BACKGROUND

This disclosure relates to a high-resolution lithography process that uses a diffuse beam of electrons.

Current lithographic processes at the nanometer scale are limited by throughput and resolution. High-throughput techniques typically have lower resolutions, while high resolutions are only achievable through processes that are too slow for volume manufacture. Available photolithographic processes include deep ultraviolet (UV) and ultra-deep UV. Deep UV processes can achieve resolutions of 150 nanometers (nm) and have processing times on the order of tens of seconds per wafer. Ultra-deep UV processes, also referred to as extreme UV, achieve higher resolutions, on the order of tens of nanometers, but have processing times on the order of minutes per wafer. In addition, the smallest feature size in extreme UV is achieved using diffraction effects, so only simple patterns are possible.

Electron beam (e-beam) lithography can produce feature sizes lower than ten nanometers, and can accurately produce complex patterns. However, current e-beam techniques draw patterns on wafers by scanning a focused electron beam over the laser. This process can take hours per wafer, so it is not suitable for volume production. Microcontact printing can also achieve very high resolutions on the order of nanometers, and is also very fast, on the order of tens of seconds per wafer. However, microcontact printing has technical disadvantages that make it unsuitable for some semiconductor applications. For example, microcontract printing leaves a residue, the removal of which damages p-type gallium nitride, and microcontact printing cannot accommodate surfaces that are not flat.

SUMMARY

Embodiments relate to a lithography system and process that achieve both a high resolution and a high throughput. In particular, embodiments relate to an electron flood lithography process in which a wafer is covered by a stencil mask and exposed to a diffuse beam of electrons.

In some embodiments, a lithography system includes an electron source, a lens, and a stencil mask. The electron source emits a beam of electrons. The lens converts the emitted beam of electrons into a diffuse beam of parallel electrons. The stencil mask is positioned between the lens and a semiconductor wafer with an electron-sensitive resists. The stencil mask has a pattern to selectively pass portions of the diffuse beam of parallel electrons onto the electron-sensitive resist of the wafer.

In some embodiments, the diffuse beam and the stencil mask cover the full area of the wafer, and the wafer can be patterned with a single exposure. In other embodiments, the diffuse beam and the stencil mask cover a portion of the wafer, and the system includes a positioning mechanism for re-positioning the wafer relative to the diffuse beam of electrons and the stencil mask, so that the whole wafer is patterned through repeated exposure.

In some embodiments, the lens is focused at a position an infinite distance away from the lens. The lens may be electromagnetically synthesized.

In some embodiments, the stencil mask is a chromium mask. The feature size of the chromium mask may be below ten nanometers. In some embodiments, the electron source is a cathode ray source, and the system operates in a vacuum.

Embodiments also relate to a method of patterning a semiconductor wafer. A patterned stencil mask is positioned over a semiconductor wafer. The semiconductor wafer has an electron-sensitive resist on a top of the semiconductor wafer. The patterned stencil mask selectively exposes one or more portions of the top of the semiconductor wafer having the electron-sensitive resist. A beam of parallel electrons is generated over the patterned stencil mask. Responsive to generating the beam of parallel electrons, the beam of parallel electrons irradiates the one or more exposed portions of the semiconductor wafer. Responsive to irradiating the one or more exposed portions of the semiconductor wafer, at least a portion of the electron-sensitive resist is removed to obtain a patterned semiconductor wafer.

In some embodiments, an electron source generates a beam of electrons, and a lens converts the beam of electrons into the beam of parallel electrons. In some embodiments, the electron-sensitive resist is applied to the top of the semiconductor wafer. In some embodiments, irradiating one or more exposed portions of the semiconductor wafer to the beam of parallel electrons activates a dopant layer in the semiconductor wafer.

DETAILED DESCRIPTION

Embodiments relate to electron flood lithography processes and systems in which a wafer is covered by a stencil mask and exposed to, or "flooded" by, a diffuse beam of electrons. Using a diffuse beam of electrons allows an area of the wafer, or the whole wafer (depending on the size of the beam and the stencil mask), to be irradiated at one time. This enables high throughput for volume processing. In addition, electron lithography provides higher resolution than optical lithography methods, so the electron flood lithography system can be used to produce high resolution patterns at higher throughput.

Figure 1:
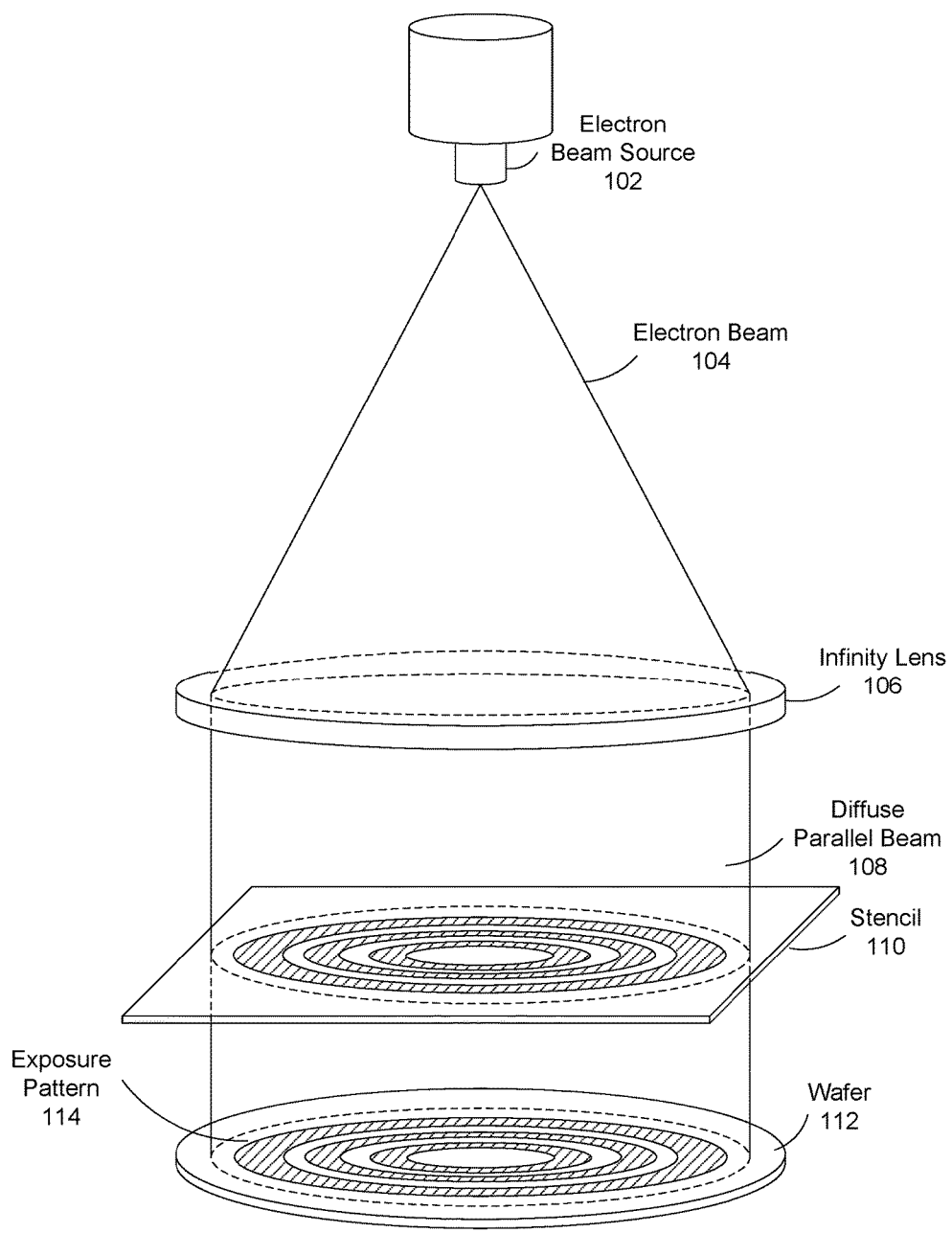
FIG. 1 is a diagram of a single-exposure electron flood lithography system, according to one embodiment.

FIG. 1 is a diagram of a single-exposure electron flood lithography system 100, according to one embodiment. The lithography system 100 includes an electron beam source 102, an infinity lens 106, a stencil 110, and a wafer 112.

The electron beam source 102 produces an electron beam 104. The electron beam source 102 may be a cathode ray source, which includes an electron source, or cathode, in a high vacuum. In operation, electrons emitted by the cathode are accelerated toward one or more anodes (not shown in FIG. 1) to form the electron beam 104. The electron beam source 102 may use thermionic emission or another emission mechanism. In some embodiments, the electron beam source 102 is a small electron point source, similar to the electron beam source used in traditional electron beam lithography.

The electron beam 104 passes through the infinity lens 106, which shapes the electron beam 104 into a diffuse parallel beam of electrons 108. Electrons travelling in a vacuum can be manipulated by electromagnetic fields to adjust the shape of the beam. In the system 100, an infinity lens 106 can be used to shape the electron beam 104 output by the electron beam source 102 into a diffuse parallel beam 108 in which the electrons are collimated and distributed throughout the area covered by the beam. An infinity lens 106 is a lens that is focused at a position an infinite distance away from the infinity lens 106, so that the electrons output by the lens travel along parallel lines. The lens 106 may be synthesized electromagnetically. In some embodiments, the physical components of the lens 106 for inducing the electromagnetic field for shaping the diffuse parallel beam 108 is positioned around the electron beam 104 and the diffuse parallel beam 108, so that the electron beam 104 does not collide with the physical components of the lens 106.

The resolution of the lithography process is determined at least in part by how parallel the electron paths are in the diffuse electron beam 108. If the electrons travel on paths that are highly parallel to each other, a higher resolution and smaller feature size can be achieved than if the electrons' paths are less parallel. A highly parallel diffuse beam 108 can be achieved using a small electron point source and a lens 106 focused at infinity.

The diffuse parallel beam 108 travels downward in FIG. 1 towards the stencil 110, which selectively passes portions of the diffuse parallel beam 108 onto the wafer 112, which is positioned below the stencil 110. The stencil 110 has a pattern formed by the stencil material and holes; a portion of the electrons in the diffuse parallel beam 108 travel through the holes in the pattern, and a portion of the electrons in the diffuse parallel beam 108 are blocked by the stencil material. Unlike a photolithography mask, the stencil 110 does not have a backplane. In some embodiments, the stencil 110 is a chromium patterned mask. The stencil 110 may be patterned using standard e-beam lithography. The stencil 110 can have very small features, on the order of nanometers. The stencil 110 is ablated over time by exposure to the diffuse parallel beam 108, in particular, by the portion of the electrons in the diffuse parallel beam 108 that are blocked by the stencil 110.

The passed portion of the diffuse parallel beam 108 irradiates the wafer 112 in an exposure pattern 114. The exposure pattern 114 follows the pattern on the stencil 110, as shown in FIG. 1. In this configuration, the whole wafer 112 can be patterned by the stencil 110 in a single exposure because the diffuse parallel beam 108 and the stencil 110 are roughly the same area as the wafer 112, and the exposure pattern 114 covers most of the wafer 112. The wafer 112 is coated with an electron-sensitive resist. The portion of the diffuse parallel beam 108 that irradiates the wafer 112 changes the solubility of the resist on the wafer 112. After exposure, the wafer 112 can be developed by immersing the wafer in a solvent 112 which selectively removes either the exposed or non-exposed regions of the wafer 112, depending on the type of resist used. The electron-sensitive resist may be similar to or the same as a resist used in prior e-beam lithography processes. For example, a poly(methyl methacrylate) resist may be used. After the wafer 112 is developed, the exposed portions of the wafer 112 (i.e., the portions that were under the selectively removed regions) can be etched, and then the remaining resist can be removed.

The size of the features in the exposure pattern 114 and on the developed wafer will correspond to the feature size in the stencil 110, which, as mentioned above, can have features on the order of nanometers. In addition, as mentioned above, a highly parallel diffuse beam 108 helps achieve this high resolution. Thus, the lithography system 100 having an infinity lens 106 for generating a parallel electron beam 108 can achieve high resolution patterning, on the order of nanometers. If the electrons do not travel on parallel or nearly parallel paths (i.e., if the lens 106 does not result in a highly parallel diffuse beam 108), the electrons will hit the wafer 112 at various angles, and the lines in the exposure pattern 114 will stray somewhat from the lines of the pattern on the stencil 110. In embodiments where the infinity lens 106 produces a less strongly parallel beam, the stencil 110 can have larger feature sizes, e.g., on the order of tens of nanometers.

In addition to producing a high resolution exposure pattern 114 in a relatively short amount of time, another advantage of the lithography system 100 is that it may pattern the wafer 112 even if the top surface of the wafer 112 is not flat. While microcontact printing can achieve a high resolution with fast throughput, it cannot accommodate surfaces that are not flat.

Figure 2:
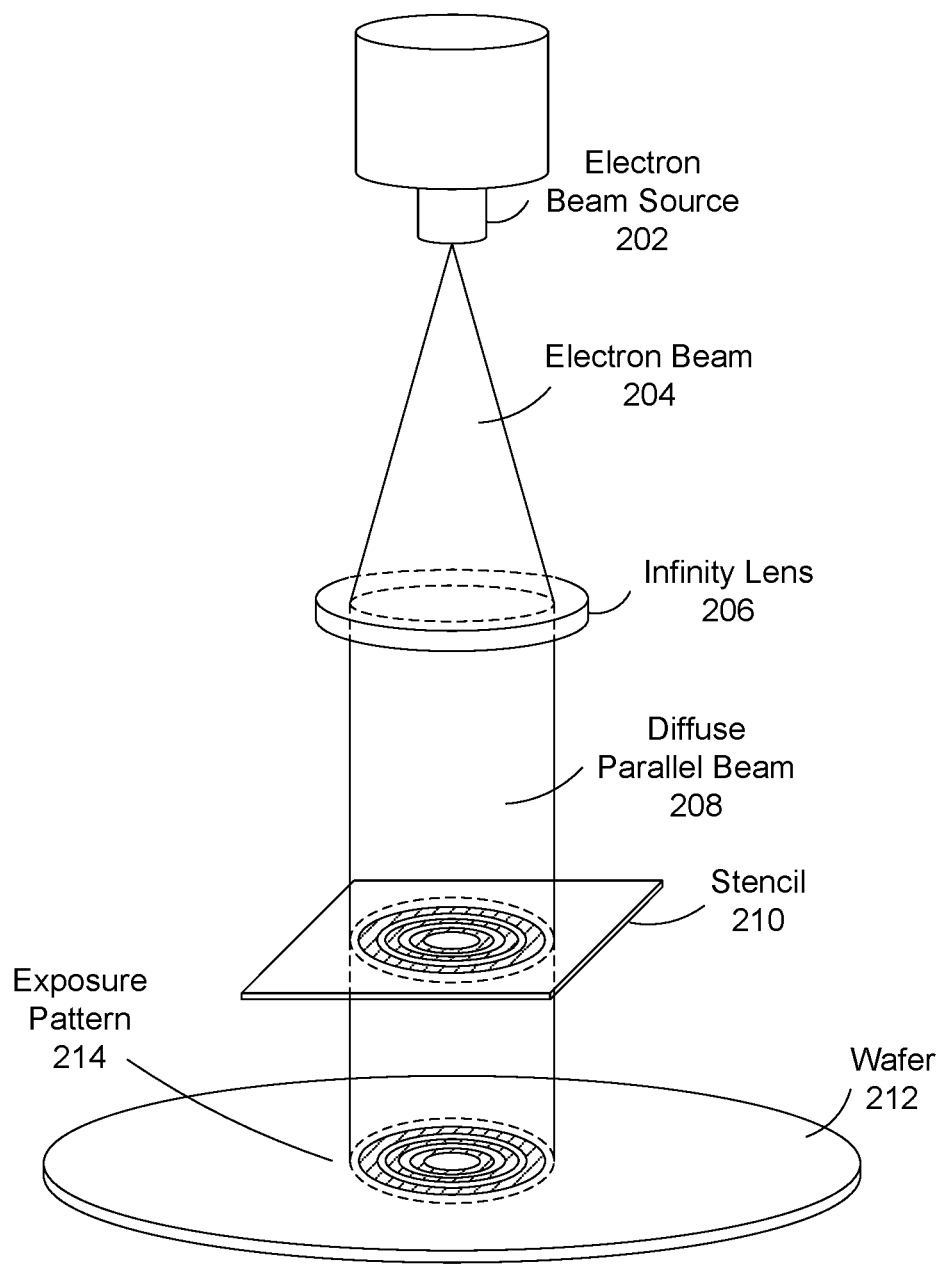
FIG. 2 is a diagram of a step-and-repeat electron flood lithography system, according to one embodiment.

FIG. 2 is a diagram of a step-and-repeat electron flood lithography system 200, according to one embodiment. The lithography system 200 includes an electron beam source 202, an infinity lens 206, a stencil 210, and a wafer 212, which are similar to the electron beam source 102, infinity lens 106, stencil 110, and wafer 112 described with respect to FIG. 1. However, the diffuse parallel beam 208 shaped by the infinity lens 206 in FIG. 2 is narrower than the diffuse parallel beam 108 shaped by the infinity lens 106 in FIG. 1. In addition, the stencil 210 has a smaller patterned area than the stencil 110 in FIG. 1, and the exposure pattern 214 created on the wafer 212 covers a smaller area of the wafer 212 than the exposure pattern 114 in FIG. 1 covered of the wafer 112 in FIG. 1.

In the lithography system 100 in FIG. 1, the whole wafer 112 could be patterned by the stencil 110 in a single exposure because the area of the stencil mask is at least as large the area of the top of the wafer 112, which is covered by the electron-sensitive resist, and the area covered by the diffuse parallel beam 208 is at least as large as the patterned portion of the stencil 110. In the lithography system 200 of FIG. 2, only a portion of the wafer 212 can be patterned by the stencil 210 in one exposure.

In some embodiments, the same exposure pattern 214 is irradiated on the wafer 212 in multiple locations by moving the wafer 212 relative to the stencil 210, infinity lens 206, and electron beam 202. This repeated exposure process is known as step-and-repeat processing. For example, as described further with respect to FIG. 4, the wafer 212 can be held in an adjustable stage that moves the wafer 212 underneath the diffuse parallel beam 208, which can be turned on when the wafer 212 is in position, and turned off as the wafer 212 is moved. In other embodiments, the wafer 212 may be patterned using multiple different stencils 210 to expose different parts of the wafer 212 with different exposure patterns 214. In some embodiments, the same wafer 112 or the same portions of the wafer 212 are exposed multiple times, using different stencils, if the desired features cannot be patterned in a single exposure.

Because the lithography system 100 of FIG. 1 uses only a single exposure to pattern the wafer 112 with the exposure pattern 114, this system 100 allows faster throughput than the lithography system 200 of FIG. 2, which uses multiple exposures to pattern the entire wafer 212. However, because the lithography system 200 of FIG. 2 can use different stencils 210 on different portions of a single wafer 212, and vary the arrangement between wafers 212, this system 200 provides higher versatility in the patterning of the wafer 212 compared to the lithography system 100 of FIG. 1. In addition, the lithography system 200 in FIG. 2 uses a narrower diffuse beam 208 than the diffuse beam 108 of FIG. 1, and a narrower diffuse beam of parallel electrons may be easier to produce. For example, if the edges of the diffuse parallel beam 108 in FIG. 1 are less parallel than the edges of the diffuse parallel beam 210 in FIG. 2, then for a high resolution pattern, it would be preferable to use the more parallel beam 208 multiple times to pattern the wafer 212 for the highest quality patterning.

Figure 3:
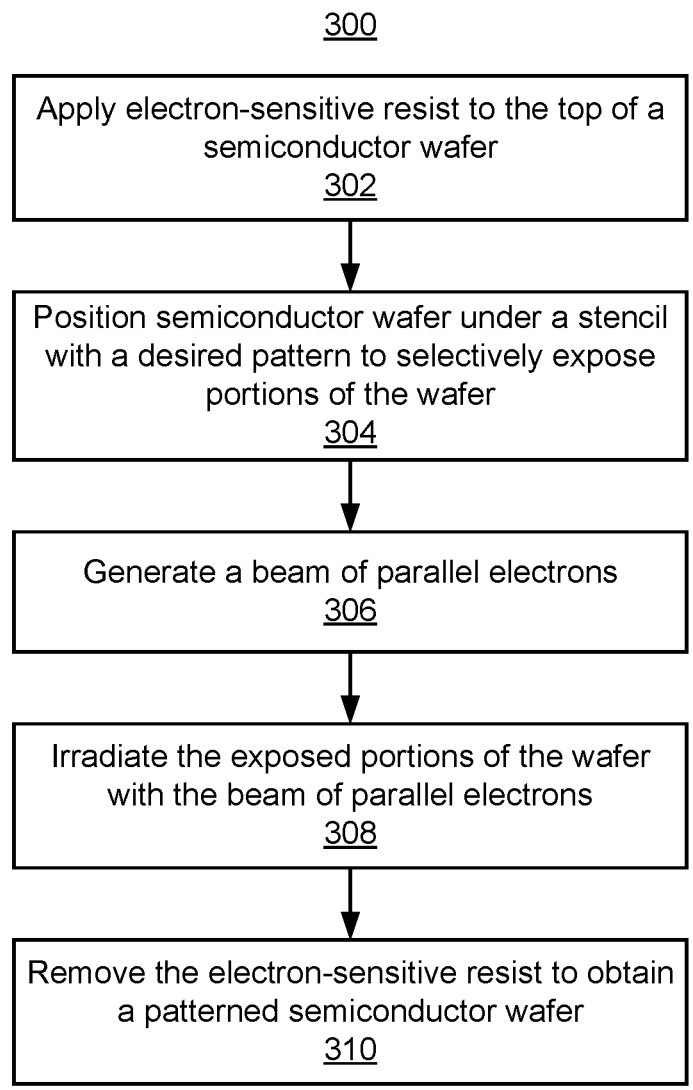
FIG. 3 is a flowchart illustrating a process for patterning a semiconductor wafer using electron flood lithography, according to one embodiment.

FIG. 3 is a flowchart illustrating a process 300 for patterning a semiconductor wafer using electron flood lithography, according to one embodiment.

An electron-sensitive resist is applied 302 to the top of a semiconductor wafer, such as the semiconductor wafers 112 or 212 in FIGS. 1 and 2. The semiconductor wafer is then positioned 304 under a stencil, such as stencil 110 or 210, with a desired pattern for selectively exposing portions of the wafer. If the stencil is smaller than the surface area of the wafer, as in FIG. 2, the desired portion of the wafer for patterning is positioned under the stencil.

After the semiconductor wafer has been positioned 304, a beam of parallel electrons is generated 306. For example, a diffuse beam of parallel electrons 108 or 208 may be generated by an electron point source, which generates the electrons, and an electromagnetic lens, such as infinity lens 106 or 206, which shapes the electron beam.

The beam of parallel electrons irradiates 308 the exposed portion of the wafer. As shown in FIGS. 1 and 2, the portion of the beam of parallel electrons that is not blocked by the stencil 110 or 210 irradiates the wafer 112 or 212 in an exposure pattern 114 and 214. The exposure pattern is formed by the exposed portion of the wafer. In some embodiments, irradiating the wafer 112 or 212 also activates a dopant layer in the semiconductor wafer when a portion of the electrons pass through the resist and into the semiconductor. For example, if the semiconductor wafer has one or more layers of p-doped gallium nitride (p-GaN) on its surface, the electron exposure can activate a self-aligning conduction path in the p-GaN.

After the electron-sensitive resist has been patterned, the resist is removed 310 from the wafer to obtain a patterned semiconductor wafer. After being developed, the wafer can be etched, and then the remaining resist can be removed, as described with respect to FIG. 1. In some embodiments, the wafer is exposed multiple times before being developed. In a step-and-repeat process, the same stencil is used to irradiate different parts of the wafer. In a multi-patterning process, a whole wafer or a single portion of the wafer is irradiated two or more times, using different stencils for each irradiation. This can be used to achieve higher resolution or more complex patterns.

Figure 4:
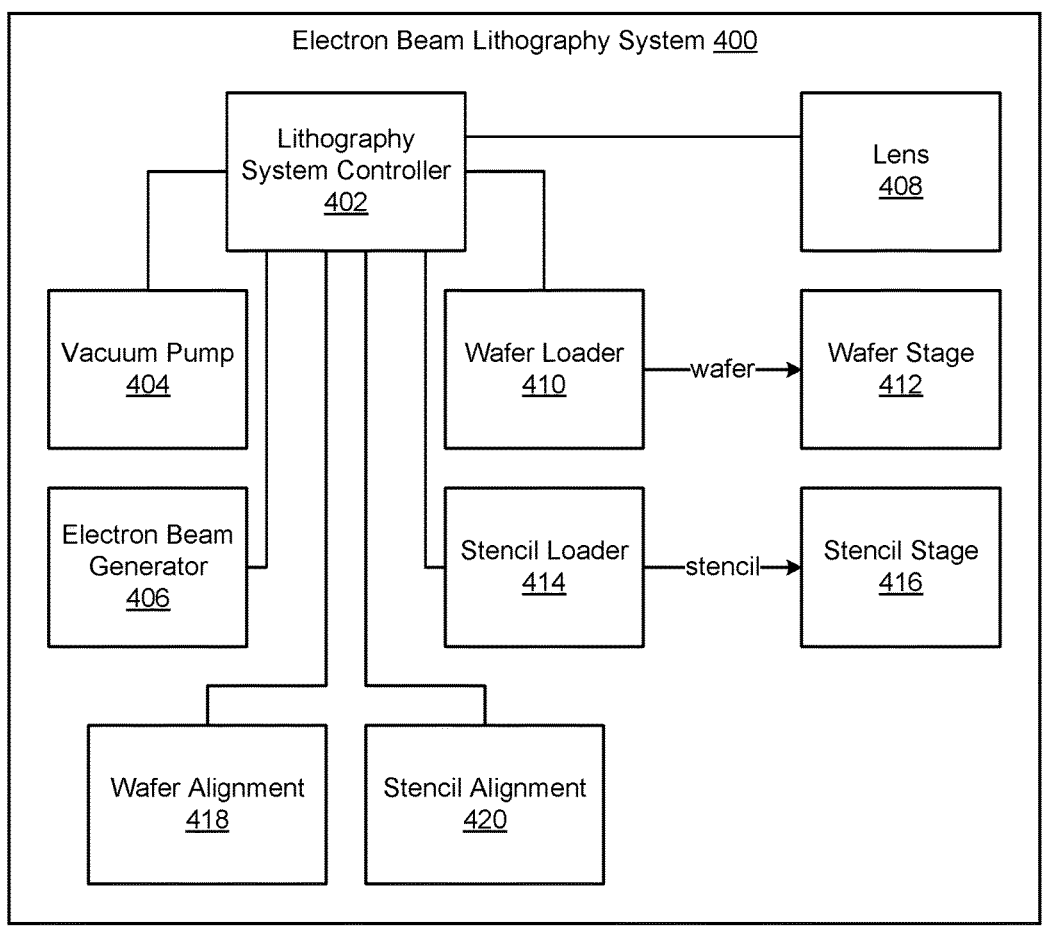
FIG. 4 is a block diagram of an electron beam lithography system, according to one embodiment.

FIG. 4 is a block diagram of an electron beam lithography system 400, according to one embodiment. The system 400 includes a lithography system controller 402, a vacuum pump 404, an electron beam generator 406, a lens 408, a wafer loader 410, a wafer stage 412, a stencil loader 414, a stencil stage 416, wafer alignment 418, and stencil alignment 420.

The lithography system controller 402 is a processing system that receives input from and controls several elements of the lithography system 400. The lithography system 402 is in communication with the vacuum pump 404, the electron beam generator 406, the lens, the wafer loader 410, the stencil loader 414, the wafer alignment 418, and the stencil alignment 420. These elements are described below. In other embodiments, the lithography system 400 includes multiple controllers for controlling different aspects of the system 400. In some embodiments, the system lithography controller 402 includes or controls on or more sensors to obtain data related to the lithography environment and process.

The vacuum pump 404 creates and maintains the vacuum in the electron beam lithography system 400. If certain elements of the lithography system (e.g., the electron beam generator 406, the lens 408, the stencil, and the semiconductor wafer) are not operated in a vacuum or near-vacuum, the electrons will collide with other particles in the air, hindering the operation of the lithography system 400. In some embodiments, the vacuum pump 404 also monitors the quality of the vacuum in the system 400. In such embodiments, the vacuum pump 404 may transmit signals to the controller 402 indicating the quality of the vacuum, e.g., signals indicating the level of the vacuum, or signals indicating whether the vacuum is or is not suitable for lithography. Alternatively, a vacuum pump that monitors the quality of the vacuum may operate independently from the lithography system controller 402. In other embodiments, the lithography system controller 402 monitors the vacuum and transmits signals to the vacuum pump 404 instructing the vacuum pump 404 to turn on, or instructing the vacuum pump 404 to increase or decrease the level of vacuum.

The electron beam generator 406 emits a beam of electrons. The electron beam generator 406 may be similar to the electron beam sources 102 and 202 described with respect to FIGS. 1 and 2, respectively. The electron beam generator 406 receives signals from the lithography system controller 402 instructing the electron beam generator 406 to turn on or off. If the electron beam generator 406 is adjustable, the lithography system controller 402 may provide one or more parameters (e.g., a voltage difference between the cathode and the anode, or a density for the electron beam). The lithography system controller 402 may receive signals with feedback information from the electron beam generator 406.

The lens 408 shapes the electron beam output by the electron beam generator 406. The lens may be similar to the electromagnetic lenses 106 and 206 described with respect to FIGS. 1 and 2, respectively. The lens 408 receives signals from the lithography system controller 402 instructing the lens 408 to turn on or off. If the lens 408 is adjustable, the lithography system controller 402 may provide one or more parameters (e.g., a field strength or shape). The lithography system controller 402 may receive signals with feedback information from the lens 408.

The wafer loader 410 loads a wafer into the wafer stage 412. The wafer loader 410 receives or picks up a wafer, such as the semiconductor wafers 112 and 212 described with respect to FIGS. 1 and 2, respectively. The wafer loader 410 then deposits the wafer into the wafer stage 412, which holds the wafer during exposure. The wafer loader 410 may remove the wafer from the wafer stage 412 after exposure is completed, or a separate mechanism may be included in the electron beam lithography system 400 to remove patterned wafers.

Similarly, the stencil loader 414 loads a stencil onto the stencil stage 416. The stencil loader 414 receives or picks up a stencil, such as the stencils 110 and 210 described with respect to FIGS. 1 and 2, respectively. The stencil loader 414 then deposits the stencil into the stencil stage 416, which holds the stencil during exposure. The stencil loader 414 may remove the stencil from the stencil stage 416, or a separate mechanism may be included in the electron beam lithography system 400 to remove stencils. In some embodiments, the electron beam lithography system 400 includes multiple stencil loaders 414 and stencil stages 416. This may be useful for multi-patterning processes in which a single wafer is exposed using multiple different stencils, so that the electron beam lithography system 400 can quickly move between stencils without unloading and reloading the stencil stage 416.

The wafer loader 410 and the stencil loader 414 are controlled by the lithography system controller 402. In particular, the lithography system controller 402 instructs the wafer loader 410 and the stencil loader 414 when to load a wafer or a stencil, and when to remove a wafer or a stencil. In typical volume processing, the stencil is reused over multiple wafers, so the stencil loader 414 changes the stencil less frequently than the wafer loader 410 changes the wafer. The lithography system controller 402 may receive signals with feedback information from the wafer loader 410 and the stencil loader 414.

If the electronic beam lithography system 400 is configured to reposition the wafer during the exposure process, e.g., in a step-and-repeat system such as the system 200 shown in FIG. 2, the wafer stage 412 may also include a mechanism for precisely moving the wafer underneath the electron beam generator 406, lens 408, and stencil stage 416. For example, the wafer stage 412 may be connected to a set of worm screws or linear motors for precisely moving the wafer stage 412 holding the wafer. In this embodiment, the lithography system controller 402 may also be connected to the wafer stage 412 and configured to send signals to control the movement wafer stage 412.

The electron beam lithography system controller 400 also includes a wafer alignment system that includes a wafer alignment mechanism 418 for adjusting the position of the wafer stage, and a stencil alignment mechanism 420 for adjusting the position of the stencil stage. The wafer alignment system may further include sensors for detecting the positions and alignment of the stencil and the wafer. The alignment system may use alignment markings on the pre-patterned wafer to assist in aligning. In some embodiments, the exposure of a wafer creates alignment markings that can be used to assist aligning subsequent exposures. The alignment system may realign the wafer and the stencil at periodic intervals during operation, e.g., after a set number of exposures or a set number of wafers.

Upon reading this disclosure, a reader will appreciate still additional alternative structural and functional designs through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:

1. A system for lithography comprising:
   an electron source for emitting a beam of electrons;
   a lens for converting the emitted beam of electrons into a diffuse beam of parallel electrons; and
   a stencil mask between a semiconductor wafer with an electron-sensitive resist and the lens, the stencil mask having a first pattern to selectively pass portions of the diffuse beam of parallel electrons onto the electron-sensitive resist to form a second pattern on the semiconductor wafer corresponding to the first pattern, the diffuse beam of parallel electrons simultaneously projected onto an area of the stencil mask including the first pattern.

2. The system of claim 1, wherein the electron source is a cathode ray source, and the system operates in a vacuum.

3. The system of claim 1, wherein the semiconductor wafer has an area covered by the electron-sensitive resist, and an area of the stencil mask is at least as large as the area of the semiconductor wafer.

4. The system of claim 3, wherein the diffuse beam of parallel electrons has an area, and the area of the diffuse beam of parallel electrons is at least as large as a patterned area of the stencil mask.

5. The system of claim 1, wherein the semiconductor wafer has an area covered by the electron-sensitive resist, and an area of the diffuse beam of parallel electrons is smaller than the area of the semiconductor wafer covered by the electron-sensitive resist.

6. The system of claim 5, further comprising a positioning mechanism for positioning an area of the semiconductor wafer to be irradiated under the area of the diffuse beam.

7. The system of claim 1, wherein the lens is focused at a position an infinite distance away from the lens.

8. The system of claim 7, wherein the lens is synthesized electromagnetically.

9. The system of claim 1, wherein the stencil mask is a chromium mask.

10. The system of claim 9, wherein a feature size of the chromium mask is below 10 nanometers.

11. A method for patterning a semiconductor wafer comprising:
    positioning a patterned stencil mask over a semiconductor wafer having an electron-sensitive resist on a top of the semiconductor wafer, the patterned stencil mask selectively exposing one or more portions of the top of the semiconductor wafer having the electron-sensitive resist;
    generating a beam of parallel electrons over the patterned stencil mask;
    irradiating the one or more exposed portions of the semiconductor wafer with the beam of parallel electrons responsive to generating the beam of parallel electrons; and
    removing at least a portion of the electron-sensitive resist to obtain a patterned semiconductor wafer responsive to irradiating the one or more exposed portions of the semiconductor wafer.

12. The method of claim 11, further comprising applying the electron-sensitive resist to the top of the semiconductor wafer.

13. The method of claim 11, wherein irradiating one or more exposed portions of the semiconductor wafer to the beam of parallel electrons activates a dopant layer in the semiconductor wafer.

14. The method of claim 11, wherein a feature size of the patterned semiconductor wafer is below 10 nanometers.

15. The method of claim 11, wherein generating the beam of parallel electrons over the patterned stencil mask comprises:
    generating a beam of electrons using an electron source; and
    converting the beam of electrons into the beam of parallel electrons using a lens.

16. The method of claim 15, wherein the lens is electromagnetically synthesized with a focus at a position an infinite distance away from the lens.

17. The method of claim 15, wherein the electron source is a cathode ray source.

* * * * *